(12) United States Patent
Bourassa et al.

(10) Patent No.: US 11,926,714 B2
(45) Date of Patent: Mar. 12, 2024

(54) PREPARATION OF SOLVENT AND POLYMER REDISPERSIBLE FORMULATIONS OF DRIED CELLULOSE NANOCRYSTALS (CNC)

(71) Applicant: CELLUFORCE INC., Montreal (CA)

(72) Inventors: Philippe Bourassa, Montreal (CA); Myriam Methot, Québec (CA); Richard Berry, Québec (CA)

(73) Assignee: CELLUFORCE INC., Montréal (CA)

( * ) Notice: Subject to any disclaimer, the term of this patent is extended or adjusted under 35 U.S.C. 154(b) by 1118 days.

(21) Appl. No.: 16/613,995

(22) PCT Filed: May 15, 2018

(86) PCT No.: PCT/CA2018/050574
§ 371 (c)(1),
(2) Date: Nov. 15, 2019

(87) PCT Pub. No.: WO2018/209435
PCT Pub. Date: Nov. 22, 2018

(65) Prior Publication Data
US 2020/0087464 A1    Mar. 19, 2020

Related U.S. Application Data

(60) Provisional application No. 62/508,556, filed on May 19, 2017.

(51) Int. Cl.
*C08J 3/09* (2006.01)
*C30B 7/14* (2006.01)
*C30B 29/54* (2006.01)

(52) U.S. Cl.
CPC ............... *C08J 3/092* (2013.01); *C08J 3/095* (2013.01); *C30B 7/14* (2013.01); *C30B 29/54* (2013.01); *C08J 2301/02* (2013.01); *C08J 2371/02* (2013.01); *C08J 2425/06* (2013.01); *C08J 2467/04* (2013.01)

(58) Field of Classification Search
CPC .. C08J 3/092; C08J 3/095; C30B 7/14; C30B 29/54
See application file for complete search history.

(56) References Cited

U.S. PATENT DOCUMENTS

| | | |
|---|---|---|
| 5,629,055 A | 5/1997 | Revol |
| 9,222,174 B2 | 12/2015 | Garner |
| 2011/0029014 A1 | 12/2011 | Beck et al. |
| 2012/0244357 A1 | 9/2012 | Leung et al. |
| 2015/0008371 A1 | 1/2015 | Garner |
| 2016/0319467 A1 | 11/2016 | Yamato et al. |
| 2017/0037155 A1 | 2/2017 | Fox |

FOREIGN PATENT DOCUMENTS

| | | |
|---|---|---|
| CN | 105073784 A | 11/2015 |
| EP | 3088422 A1 | 11/2016 |
| JP | 2008-303361 A | 12/2008 |
| JP | 2015-143336 A | 8/2015 |
| JP | 2016-056253 A | 4/2016 |
| JP | 2017-082202 A | 5/2017 |
| WO | 2012/068670 A1 | 5/2012 |

OTHER PUBLICATIONS

Abitbol et al reference ("Surface modification of cellulose nanocrystals with cetyltrimethylammonium bromide", Nanocellulose—Nordic Pulp &Paper research Journal, vol. 29, No. (1) 2014) (Year: 2014).*
Huang, L. et al. "Modification of Cellulose Nanocrystals with Quaternary Ammonium-Containing Hyperbranched Polyethylene Ionomers by Ionic Assembly." Sustainable Chemistry and Engineering. 2016, vol. 4 pp. 4937-4950.
Saidane, D. et al. "Some Modification of Cellulose Nanocrystals for Functional Pickering Emulsions." Philosophical Transactions of the Royal Society A. 2016, vol. 374 pp. 1-11.
Salajkov A, M. et al. "Hydrophobic cellulose nanocrystals modified with quaternary ammonium salts." Journal of Materials Chemistry. 2012. vol. 22, pp. 19798-19805.
Nagalakshmaiah, M. et al. "Jonie Compatibilization of Cellulose Nanocrystals with Quaternary Ammonium Salt and Their Melt Extrusion with Polypropylene" ACS Applied Materials and Interfaces. 2016, vol. 8, pp. 8755-8764.
Abitbol, T. et al. "Surface Modification of Cellulose Nanocrystals with Cetyltrimethylammonium Bromide" Nordic Pulp and Paper Research. 2014. vol. 29, No. (1) pp. 50-57.
Azzam, F. et al. "Preparation By Grafting Onto, Characterization, and Properties of Thermally Responsive Polymer-Decorated Cellulose Nanocrystals" Biomacromolecules. 2010, vol. 11, No. 12, pp. 3652-3659.
Dong, X, M. et al. "Effect of Counterions on Ordered Phase Formation in Suspensions of Charged Rodlike Cellulose Crystallites" Langmuir 1997, vol. 13, pp. 2404-2409.
Jiang, F. et al."Acid-Catalyzed and Solvolytic Desulfation of H2SO4-Hydrolyzed Cellulose Nanocrystals" Langmuir 2010, vol. 26, No. 23, pp. 17919-17925.
Espinosa, S. C.. et al. "Isolation of Thermally Stable Cellulose Nanocrystals by Phosphoric Acid Hydrolysis" American Chemical Society, 2013, vol. 14, 1223-1230.

(Continued)

*Primary Examiner* — Shaojia A Jiang
*Assistant Examiner* — Everett White
(74) *Attorney, Agent, or Firm* — Boone IP Law (57) ABSTRACT

The disclosure provides redispersible CNC. The CNC disclosed herein is redispersible in non-polar and polar organic solvents as well as polar and non-polar polymers such as polyethylene or polypropylene. The disclosure surprisingly also provides redispersible CNC bearing improved redispersion in aqueous systems and most particularly in high ionic strength aqueous systems which usually require significant mixing energy to achieve dispersion.

15 Claims, 4 Drawing Sheets

(56) References Cited

OTHER PUBLICATIONS

Habibi, Y. et al. "TEMPO-mediated surface oxidation of cellulose whiskers" Springer 2006, Cellulose (2006) vol. 13, pp. 679-687.
Beck, S. et al. General procedure for determining cellulose nanocrystal sulfate half-ester content by conductometric titration Cellulose, (2015), vol. 22, pp. 101-116.
Oguzlu, H. et al."Interactions between cellulose nanocrystals and anionic and neutral polymers in aqueous solutions" vol. 24, 2017, pp. 131-146.
Lewis, I. et al. "Hydrothermal Gelation of Aqueous Cellulose Nanocrystal Suspensions" American Chemical Society, vol. 17, 2016, pp. 2747-2754.
B. G. Refineries "The R3TM Technology—Renewable" Nov. 2016, All Content Copyright Blue Goose Biorefineries Inc.—Website Management by Netnotic (https://netnotic.com).
Office Action (Notice of Reasons for Refusal) dated Apr. 19, 2022, by the Japanese Patent Office in corresponding Japanese Patent Application No. 2019-563103, and an English Translation of the Office Action. (10 pages).
Office Action (the First Office Action) dated Jan. 29, 2022, by the State Intellectual Property Office of the People's Republic of China in corresponding Chinese Patent Application No. 201880032004.4, and an English Translation of the Office Action. (16 pages).

* cited by examiner

Fig. 1

Fig 2. CNC/Jeffamine M-3085 dispersed in poly(styrene) at different weight ratios.

Fig 3. CNC/Jeffamine M-3085 dispersed in a polylactide resin at different weight ratios.

Fig 4. Sodium form of sulfuric acid extracted CNCs in poly(styrene) at different weight ratios.

PREPARATION OF SOLVENT AND POLYMER REDISPERSIBLE FORMULATIONS OF DRIED CELLULOSE NANOCRYSTALS (CNC)

BACKGROUND OF THE DISCLOSURE

Cellulose nanocrystals (CNC) can be extracted from cellulosic biomass such as softwood fibers by a variety of methods. Most industrially produced cellulose nanocrystals contain titrable acidic sulfate half-ester moieties introduced on the surface of the crystal by the sulfuric acid hydrolysis extraction process. Although not done industrially, CNCs can be produced by using phosphoric acid instead of sulfuric acid which results in phosphate half-ester surface functional groups. They can also be produced or modified by oxidation giving CNCs with carboxylic acid groups alone or mixed with sulfate-half esters.

Acidic CNC suspensions are typically neutralized with alkali metal hydroxides during commercial production in order to be fully redispersible in water. Organic hydroxides such as tetralkylammonium hydroxides can also be used (S. Beck, et al. US 20110290149A; X. M. Dong et al. Langmuir, vol. 13, pp. 2404-2409, 1997). The type of base used for neutralization alters the suspension properties such as viscosity and self-assembling behavior. However, redispersion of dried electrostatically charged CNCs in most organic solvents, as well as non-polar matrices, remains difficult. The capacity of a medium to solvate the counter-ion is also important when it comes to the redispersibility of dried CNCs; a solvent can have a high dielectric constant but may not solvate a particular counter-ion. Upon drying, cellulose nanocrystals develop significant hydrogen bonding between particles. The solvent must also be able to break these nanoparticle-nanoparticle interactions in order to achieve nanometric dispersions.

High concentrations of electrolytes screen the CNC surface charge, which leads to double layer compression, a decrease in electrostatic repulsion and hence interparticle distance and the subsequent agglomeration of the cellulose nanocrystals. If charged CNC suspensions are dried, the redispersion properties can be negatively affected if the suppressed electrostatic repulsions cannot overcome the overall attractive interactions between the nanocrystals. Consequently, the full redispersion of dried CNCs is difficult, for example, in high ionic strength media.

There is a need to provide surface modified CNC to facilitate dispersion of CNC in various solvents/polymer matrices. In particular, there is a need for methods not requiring complex chemical reactions, use of hazardous organic solvents involving multiple steps. Further, there is a need for surface-modified CNC and method of making same at an industrial scale with commercially acceptable production costs.

SUMMARY OF THE DISCLOSURE

An aspect relates to a redispersible cellulose nanocrystal (CNC) wherein said CNC is comprising non-covalent ionic adducts of cationic groups formed from a protonated amine compound and anionic groups formed from titrable acidic groups, wherein said titrable acidic groups are located at the surface of said CNC, wherein said titrable acid group is comprising sulfate or phosphate half-esters, carboxylic acids or mixtures thereof, and wherein said redispersible CNC is in an isolated dried form.

An aspect relates to a method for producing an isolated dried redispersible cellulose nanocrystal (CNC) comprising
i) Providing an aqueous suspension of an acidic CNC;
ii) Mixing an amount of an amine compound with said suspension of an acidic CNC, wherein said amount is sufficient to cause the pH of said suspension to increase to about below the pKa of the protonated amine compound; and
iii) Drying the suspension resulting from step ii to produce said redispersible CNC.

An aspect relates to a polymer composite comprising a redispersible CNC as defined herein.

DETAILED DISCLOSURE

The disclosure provides redispersible CNC. The CNC disclosed herein is redispersible in non-polar and polar organic solvents such as ethanol, acetone, toluene and chloroform. The present formulations of CNCs are also useful in achieving proper dispersions of CNCs in polar polymers such as polylactic acid and non-polar polymers such as polyethylene, polypropylene or polystyrene. The disclosure surprisingly also provides redispersible CNC bearing improved redispersion in aqueous systems and most particularly in high ionic strength aqueous systems which usually require significant mixing energy to achieve dispersion.

The redispersible CNC disclosed herein avoids the need for covalently grafting polymer chains onto the cellulose nanocrystals as described in the prior art.

The disclosure provides a method for making said CNC. The method can be conducted in aqueous media using commercially available CNC or CNC modified by methods such as oxidation or desulfation.

In the method herein, the protonated amine compound forms a non-covalent ionic adduct with the anionic charged group from the CNCs titrable acid groups (i.e. located at the surface of the nanocrystals). The titrable acid groups content are most commonly, although not limited to, sulfate or phosphate half-esters or carboxylic acids or mixtures of these groups.

When the amine compound is added to CNC suspensions comprising titrable acid groups, the amine group is believed to remove a proton of the acidic group on the CNC surface, which can be schematically represented by the following acid-base neutralization reaction.

(eq. 1)

(eq. 2)

(eq. 3)

(eq. 4)

In one embodiment, there is therefore provided a redispersible cellulose nanocrystal (CNC) wherein said CNC is comprising a non-covalent ionic adduct made from the reaction of an amine compound with titrable acid groups, wherein said titrable acid groups are located at the surface of said CNC, wherein said titrable acid group is comprising sulfate or phosphate half-esters, carboxylic acids or mixtures thereof, and wherein said redispersible CNC is in an isolated dried form.

CNC

As used herein, "acidic CNC" refers to CNC having neutralizable acidic protons (i.e. on sulfonic, phosphonic, carboxylic groups or mixtures thereof) present on the surface of the nanocrystals.

In accordance with this disclosure, the acidic CNC that may be used can be purchased or obtained from various approaches using controlled hydrolysis with a strong mineral acid. The use of sulfuric acid causes partial esterification of some of the primary hydroxyl groups on the exposed cellulose leaving a sulfate half-ester group which retains a single negative charge at the nanocrystal surface (J.-F. Revol et al. U.S. Pat. No. 5,629,055).

The surface charge can be reduced by desulfation (DS) in a post-treatment after sulfuric acid hydrolysis (F. Jiang, et al. Langmuir, vol. 26, pp. 17919-17925, 2010).

Phosphoric acid can also be used to produce cellulose nanocrystals with similar suspension properties through the introduction of phosphate half-esters (S. C. Espinosa, et al. Biomacromolecules, vol. 14, p. 1223-1230, 2013).

It is also possible to extract cellulose nanocrystals by oxidation from biomass such as wood pulp. Such oxidation processes generate carboxylic acids on the surface of the nanocrystals. Persulfate salts can be used to generate a carboxylated form of charged cellulose nanocrystals (C. Woon Leung, et al. US 2012/0244357) as can hydrogen peroxide in an acidic environment (B. G. Refineries, November 2016 «The R3TM Technology—Renewable,»: http://bluegoosebiorefineries.com/our-technology/). Both methods lead to carboxylated cellulose nanocrystals.

Sulfuric acid extracted cellulose nanocrystals can be further oxidized, for example by using the catalytic TEMPO/NaOCl/NaBr system (Y. Habibi, et al. Cellulose, vol. 13, pp. 679-687, 2006). This method leaves the sulfate-half ester group intact giving a surface bearing both sulfate-half esters and carboxylic acids.

The cellulose nanocrystals may be used as-is or, as described above, modified after extraction by desulfation or oxidation before adding the amine compound to give products with different final redispersion properties. This further step plus the choice of amine compound can tune the dispersibility properties of the dried CNC.

In one embodiment, said titrable acid group is comprising sulfate half-esters (unmodified or desulfated), carboxylic acids or mixtures thereof. In one embodiment, said titrable acid group is comprising sulfate half-esters (unmodified or desulfated). In one embodiment, said titrable acid group is comprising carboxylic acids. In one embodiment, said titrable acid group is a mixture comprising sulfate half-esters (unmodified or desulfated), and carboxylic acids.

In this method, different stoichiometric ratios of amine compound to titrable acids can be used but a ratio of at least 1 to 1 is preferred for optimal redispersion.

The initial surface charge density of the cellulose nanocrystal as well as the amount of amine compound added controls the redispersion properties of the dried product.

The redispersible CNC as defined herein has several important features. The dried product has much lower bulk density when dried. Another noteworthy feature of the material is that it is also more pliable upon pressing. Unlike untreated CNC, the dried product can be molded into redispersible transparent pellets simply by pressing the material. Such a change in form improves the handling of the material preventing dusting that may occur with other forms of the material.

Amine Compounds

The disclosure uses amine compounds, preferably amine terminated compounds such as amine-terminated polyalkanes, amine-terminated polyalkylethers or amine-terminated polyalkylene imine to neutralize the acidic CNC rather than alkali-metal or quaternary ammonium hydroxides or salts thereof.

More specifically, mono amines are preferred for redispersion qualities. Molecular weights of amine-terminated polyalkane, amine-terminated polyalkylether or amine-terminated polyethylene imine monoamine compounds may be between 300 and 5000 g/mol, but more preferably between 2000 and 3000 g/mol. Higher molecular weights of the polymer amine allows the dispersion of the CNC-polymer amine adduct in a greater range of solvents.

The amine compounds are basic, preferably having a pKa of the amine between 10-12, and form an ammonium salt with the acidic groups of the CNC.

In one embodiment, the amine-terminated polyalkylether has the formula:

$$R_1\text{—}[O(CH_2)_x]_a\text{—}[OCH_2CH(CH_3)]_b\text{—}NH_2 \quad (I)$$

wherein said polyalkylether may be a homopolymer, an AB or ABA block copolymer, or an alternating copolymer.

$R_1$ is H, or selected from an optionally substituted, linear or branched alkyl of 1 to 14 carbon atoms most preferably, $R_1$ is $CH_3$; or $R_1$ is an optionally substituted aryl of 6 to 10 carbon atoms; or $R_1$ is an alkyl-arylene- group wherein each of said alkyl and arylene residues are independently optionally substituted and further said alkyl residue is linear or branched alkyl of 1 to 14 carbon atoms and said arylene residue is comprising 6 to 10 carbon atoms.

a or b are each independently an integer from 1 to 60, or alternatively 1 to 50, wherein optionally one of said a or b may be zero (0) in the case of an homopolymer.

x is an integer from 1 to 4, preferably 2, in the case of ethylene oxide. Methylene oxide (x=1), trimethylene oxide (x=3) or tetramethylene oxide (x=4) based polyalkylethers are also be contemplated.

In one embodiment, in the amine-terminated polyalkylether formula (I)

$R_1$ is $CH_3$;

a or b are each independently an integer from 1 to 60;

x is 2.

Ethylene oxide (EO)- or propylene oxide (PO)-based, or a co-polymer with both monomers in different ratios are preferred but other types of amino terminated polyalkylethers such as poly(tetramethylene glycol) can also be used.

One embodiment is comprising an amine-terminated polyethylene oxide, or an amine-terminated polypropylene oxide or an amine-terminated polyethylene/polypropylene oxide. In one embodiment, the amine-terminated polyethylene/polypropylene oxide has a PO/EO ratio of from 1/10 to 10/1.

In one embodiment, examples of amine-terminated polyalkylether include those having the formula:

wherein a and b are as defined above, R2 at each occurrence of monomer b can be R2=H for ethylene oxide (EO) and R2=CH₃ for propylene oxide (PO). In one embodiment, the polyethylene/polypropylene oxide (PO/EO) ratio is from 1/10 to 10/1 and preferably the molecular weight may be between 300 and 5000 g/mol, but more preferably between 600 and 3000 g/mol.

In particular, examples of amine-terminated polyalkylether include those for which in the above formula

| PO/EO mol ratio | MW (approx.) | Commercial name |
|---|---|---|
| 9/1 | 600 | Jeffamine M-600 ™ |
| 3/19 | 1000 | Jeffamine M-1000 ™ |
| 29/6 | 2000 | Jeffamine M-2005 ™ |
| 10/31 | 2000 | Jeffamine M-2070 ™ |
| 4/41 | 2000 | Jeffamine M-2095 ™ |
| 8/58 | 3000 | Jeffamine M-3085 ™ |

In one embodiment, further examples of amine-terminated polyalkylether include: $CH_3(CH_2)_{12}$—$OCH_2CH(CH_3)$—$OCH_2CH(CH_3)$—$NH_2$, (also designated as catalog number XJT-435 by Huntsman); and (also designated as catalog number XTJ-436 by Huntsman) The molecular weight of the amine-terminated polyalkylether may be 500 to 3000 g/mol In one embodiment, the amine-terminated polyalkane has the formula:

wherein $R_{11}$ is selected from an optionally substituted, linear or branched alkyl of 3 to 18 carbon atoms.

Examples of such compounds are n-propylamine or n-octylamine.

The molecular weight of the amine-terminated polyalkane may be 50 to 500 g/mol.

In order to favor suitable dispersion, it is desirable that the amine compound be soluble in the redispersion solvent of interest. In the case of example 4, Jeffamine M-2070 is predominantly polyethylene glycol based and is not soluble in cyclohexane while M-2005, which is predominantly polypropylene glycol based, is soluble. It was found that the TEMPO-oxidized CNC/M-2070 sample does not show good redispersion capabilities in cyclohexane while using M-2005 leads to good re-dispersion in that particular solvent. For redispersion, it is beneficial that the amine compound used in a particular adduct formulation is compatible with the media of interest.

Method of Preparing Redispersible CNC

The amine group from the amine compound removes a proton associated with the CNC surface sulfate or phosphate half-ester or carboxylic acid groups, thus leaving both the surface of the nanocrystals and the end group of the chain of the amine compound ionized. This allows the amine compound to form a non-covalent ionic adduct with the anionic charged group located at the surface of the nanocrystals. This ionic bond becomes stronger in less polar solvents. The chain of the amine compound is believed to sterically hinder the packing of the nanocrystals in the dry form and improve redispersion of the dried material in organic solvents as well as in low or high ionic strength aqueous media.

The proton exchange between the acid groups of the cellulose nanocrystals and the amino end-group of the amine compound is rapid, as opposed to grafting reactions which can take several hours and under industrially challenging conditions as stated in the prior art.

In one embodiment, the aqueous suspension of acidic CNC comprises from about 0.1 to about 10 wt/wt % acidic CNC, or preferably from 5 to 8 wt/wt %.

In one embodiment, the molar ratio of amine in said amine compound to titrable acid groups in the acidic CNC may be about 1:1. Alternatively, mixtures of the amine compound could be used jointly with conventional bases such as sodium hydroxide. In one embodiment, the molar amount of amine compound is such that the final pH of the suspension is below the pKa of the amine compound as to preserve the amine group in its charged cationic state. In one embodiment, said amount is sufficient to cause the pH of said suspension to increase to values between 3 and 10, more preferably between 6 and 9. In one embodiment, the final pH of the suspension is about neutral (i.e about 7).

In one embodiment, the method disclosed herein to prepare redispersible CNC from CNC suspensions in the acidic form requires no further purification steps.

In one embodiment, the drying step may include one or more of air drying, vacuum evaporation, freeze-drying or spray-drying.

Surface Charge Density and Mode of Interaction Between the Chains

Figure 1:
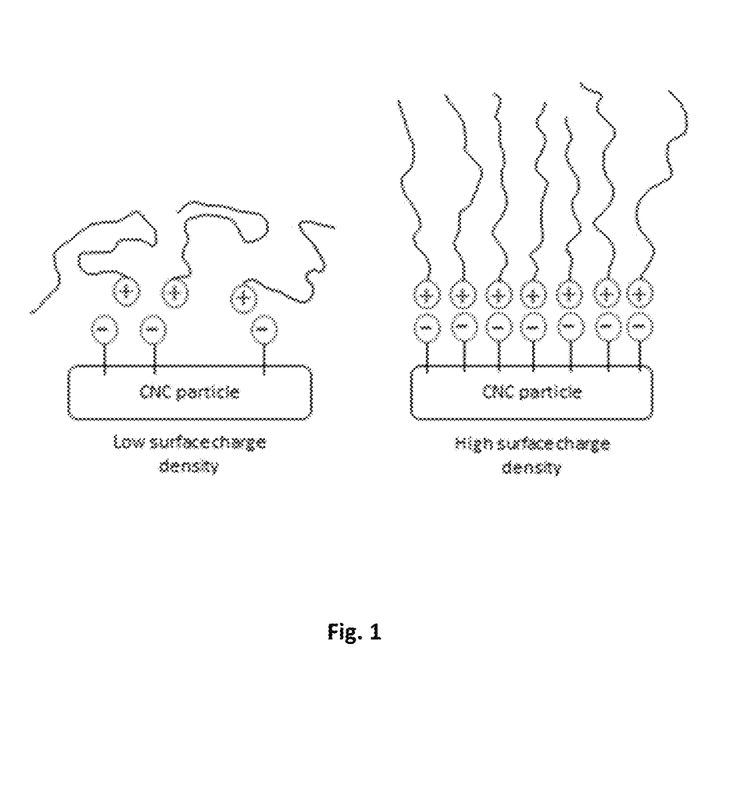
FIG. 1 depicts the CNC/amine-terminated compound adduct at different levels of charge density.

FIG. 1 depicts the CNC/amine-terminated compound adduct at different levels of charge density. Higher surface charge density allows more amine compound adsorption since there are more titrable acidic sites available. This in turn will lead to increased steric repulsions surrounding the nanoparticles. A complete coverage of the CNCs is necessary for the redispersion in non-polar media where CNC/Solvent interactions are unfavorable; the chain of the amine compound effectively shields the particle from the solvent.

The mode of interaction between the chain of the amine compound and the CNC surface is preventing aggregation and strong particle-particle in the dried form which can be difficult to overcome (S. Beck, et al, Cellulose, vol. 22, pp. 101-116, 2015).

For comparison, the addition of a regular non-ionic polyethylene glycol instead of an amine terminated polyether does not improve the redispersion of dried CNCs in organic solvents. It is hypothesized that polyethylene glycol lies flat on the surface of the nanocrystal which leads to minimal steric repulsions as opposed to what is depicted in FIG. 1 (H. Oguzlu et et al. *Cellulose*, vol. 24, pp. 131-146, 2017).

Dispersion in Polymers

One use of CNC is in the field of polymer nanocomposites. Owing to its outstanding specific mechanical properties, nanoscale dimensions and high aspect ratio, CNC is considered a good candidate for reinforcement of polymer matrices.

Incorporation of CNC in composite materials helps with the light-weighting of components specially targeted, for example, for the transportation sector. Additionally, it has been shown there are synergistic effects of using CNC with other reinforcing fibers such as fiber glass as sizing agents. Finally, there is market demand for using bio-based reinforcing agents in bio-sourced polymers such as polylactic acid (PLA) as well as improving bio-degradability of natural rubbers by incorporation of CNC.

In order for CNC to provide reinforcement, the cellulose nanocrystals have to be dispersed at the nanoscale and distributed uniformly within the polymer matrix. It is widely reported that once in this state and above a critical threshold fraction, the CNC particles can form a three-dimensional network within the polymer matrix. Additionally, for CNC to be able to provide the maximum reinforcement there must be a strong interaction and compatibility between the CNC surface and the polymer matrix.

The present disclosure provides redispersible CNC that facilitates nanometric dispersion of CNC spray-dried agglomerates in various polymer matrices. By adjusting the monoamine polymer chain length and chemical structure, it is contemplated that nanometric dispersion in hydrophobic polymers such as polyolefins (polyethylene and polypropylene) can be achieved. It is expected that tuning the structure will allow good dispersion in more polar polymers such as polyurethane and epoxy polymers.

The following examples are provided to further illustrate details for the preparation and use of the compounds of the present invention. They are not intended to be limitations on the scope of the instant disclosure in any way, and they should not be so construed. Furthermore, the compounds described in the following examples are not to be construed as forming the only genus that is considered as the invention, and any combination of the compounds or their moieties may itself form a genus.

EXAMPLES

A non-exhaustive list of tested CNC samples as well as their titrable acid content is shown in table 1. The titratable acid content was measured by conductometric titration of acidic CNC suspensions against sodium hydroxide using a method described in the literature (S. Beck, et al Cellulose, vol. 22, pp. 101-116, 2015). Sulfuric acid extracted CNC samples were obtained from CelluForce and US Forest Products Laboratory (USFPL) (Lot #2018-FPL-CNC-116). Persulfate extracted CNCs were obtained from the National Research Council of Canada (NRC). Partially desulfated CNC and Tempo-oxidized acidic CNC were prepared in FPInnovation's laboratory in Pointe-Claire, QC. For redispersion testing, the solid samples were either provided or made in spray-dried or freeze-dried forms.

TABLE 1

Tested CNC samples and their surface composition

| CNC type | Sample | Titrable acids (mmol/kg) | |
|---|---|---|---|
| | | Sulfate half-ester | Carboxylic acid |
| 1 | Partially desulfated acidic CNC | 60 | N/A |
| 2 | CelluForce sulfuric acid extracted acidic CNC | 240 | N/A |
| 3 | USFPL sulfuric acid extracted acidic CNC | 340 | N/A |
| 4 | Persulfate extracted acidic CNC | N/A | 620 |
| 5 | TEMPO-oxidized acidic CNC | 240 | 760 |

Disclosed below is the range of the different solvents tested:

| Solvent | Dielectric constant (20° C.) |
|---|---|
| Water | 80.1 |
| Ethylene glycol | 41.4 |
| Ethanol | 24.3 |
| Acetone | 20.7 (25° C.) |
| Methylethyl ketone | 18.5 |
| Ethyl acetate | 6 |
| Chloroform | 4.81 |
| Toluene | 2.38 (25° C.) |
| Cyclohexane | 2.02 |

The quality of the redispersion is also rated qualitatively as follows:
Excellent dispersion: Clear stable dispersion (at least 24 hours)
Fair dispersion: Stable dispersion (at least 24 hours) with higher haze or turbidity
Poor: Unstable dispersion with micron-sized aggregates.

Example 1) Type 2 CNC: Freeze-Dried Sulfuric Acid Extracted CNC: Dispersion in Polar Solvents (Dielectric Constant >20) (Water, Ethanol, Acetone and Ethylene Glycol)

A commercial polyetheramine from Huntsman (Jeffamine™ M-2070, m.w. 2000 g/mol) was dissolved into 200 g of a 2 wt. % sulfuric acid extracted acidic CNC suspension (pH 2.3-3.0, 240 mmol/kg of titrable acids for CelluForce CNCs or 340 mmol/kg for USFPL CNCs) until pH 7 was reached. Jeffamine™ M-2070 is miscible in all three tested solvents. The suspension was then freeze-dried under vacuum and the solid product was redispersed using 200 mg of dried material in 20 mL of solvent (1 w/v % final solids concentration). The suspensions were sonicated using an 8 mm probe sonicator (Cole-Parmer, USA) with an energy input of 2000 J at maximum amplitude. The suspension was then diluted 20 times in the appropriate solvent for a final concentration of 0.05 w/v. % for proper measurement of particle size. Sonication is not necessary to achieve nanometric dispersions but will reduce the particle size. The particle size of the CNCs in the resulting suspensions was measured by dynamic light scattering (DLS) and is reported in table 2. Typically, recorded particle sizes of <200 nm is an indication of an excellent dispersion.

TABLE 2

Redispersed particle size of the freeze-dried sulfuric acid extracted CNC/M-2070 dried product.

| Source | Solvent | M-2070 content Wt. % | Z-average (nm) | Quality of dispersion |
|---|---|---|---|---|
| CelluForce | Water | 32 | 89 ± 5 | Excellent |
| | Ethanol | 32 | 175 ± 4 | Excellent |
| | Acetone | 32 | 800 ± 48 | Fair |
| | Ethylene glycol | 32 | 102 ± 2 | Excellent |
| USFPL | Water | 36 | 79 ± 5 | Excellent |
| | Ethanol | 36 | 105 ± 5 | Excellent |
| | Acetone | 36 | 157 ± 8 | Fair |
| | Ethylene glycol | 36 | 84 ± 4 | Excellent |

Example 2) Type 2 CNC: Spray-Dried Sulfuric Acid Extracted CNC: Dispersion in Polar Solvents (Ethanol, Acetone and Ethylene Glycol)

Dried sulfuric acid extracted CNC/M-2070 adducts were also prepared by spray-drying. Briefly, a CelluForce 4.35 wt.

% sulfuric acid extracted acidic CNC suspension was neutralized with Jeffamine™ M-2070 until pH 7 was reached. The suspension was then spray-dried. The collected solid was redispersed the same way as described in example 1. The performance of the product is very similar to the freeze-dried sample, with only the dispersion in acetone showing slightly larger particle size. All suspensions were stable for at least 24 hours after redispersion.

TABLE 3

Redispersed particle size of the spray-dried CelluForce sulfuric acid extracted CNC/M-2070 dried product.

| Solvent | M-2070 content Wt. % | Z-average (nm) | Quality of dispersion |
| --- | --- | --- | --- |
| Water | 32 | 81 ± 4 | Excellent |
| Ethanol | 32 | 181 ± 5 | Excellent |
| Acetone | 32 | 910 ± 79 | Fair |
| Ethylene glycol | 32 | 77 ± 3 | Excellent |

Example 3) Type 4 CNC: Freeze-Dried Persulfate Extracted CNC: Dispersion in Polar Solvents (Ethanol, Acetone and Ethylene Glycol)

The product was obtained from the National Research Council of Canada (NRC). It was first passed through an acidic form strong acid cation exchange resin column (Dowex™ Marathon C) in order to obtain an acidic persulfate extracted CNC suspension. Jeffamine™ M-2070 was dissolved into 200 g of a 2 wt. % persulfate extracted acidic CNC suspension (620 mmol/kg of titrable acids, pH 3.1) until pH 7 was reached. The product was then freeze-dried and redispersed by sonication as described previously. The product shows excellent redispersion in water, as well as ethanol and ethylene glycol. The product also shows reduced redispersed particle size in acetone compared to example 1 and 2, as well as increased clarity, indicating good redispersibility.

TABLE 4

Redispersed particle size of the freeze-dried persulfate extracted CNC/M-2070 dried product.

| Solvent | M-2070 content Wt. % | Z-average (nm) | Quality of dispersion |
| --- | --- | --- | --- |
| Water | 45 | 82 ± 5 | Excellent |
| Ethanol | 45 | 97 ± 4 | Excellent |
| Acetone | 45 | 217 ± 6 | Excellent |
| Ethylene glycol | 45 | 75 ± 4 | Excellent |

Example 4) Type 5 CNC: Freeze-Dried TEMPO-Oxidized CNC: Dispersion in Non-Polar Solvents (Dielectric Constant <5) (Chloroform, Toluene and Cyclohexane)

Higher surface coverage of the polymer to the surface of CNCs will introduce more steric stabilization which will be helpful when redispersing CNCs in non-polar media. In this experiment, CelluForce sulfuric acid extracted CNC was oxidized using an adapted procedure from the literature (Y. Habibi, et al. Cellulose, vol. 13, pp. 679-687, 2006). Briefly, 0.03 equivalents of anhydroglucose units of TEMPO catalyst was added to a 2 wt. % CNC suspension. 0.25 eq. of sodium bromide was then added to the CNC suspension while stirring until complete dissolution. The pH of the suspension was set to 10 and kept constant throughout the reaction using sodium hydroxide. 0.4 eq. of the primary oxidant sodium hypochlorite was added dropwise and the reaction was kept stirring for an hour. Finally, the suspension was dialyzed in 12-14 kDa molecular weight cutoff cellophane membranes. The final acid content was measured to be 1000 mmol/kg by conductometric titration after dialysis and cationic resin treatment.

After oxidation, the suspension was passed through an acidic form strong acid cation exchange resin column in order to get an acidic CNC suspension. Commercial polyetheramines (Jeffamine™) were selected based on their solubility in the solvent of interest (M-2070 for chloroform and toluene, M-2005 for cyclohexane). and were dissolved into 200 g of a 2 wt. % TEMPO-oxidized acidic CNC suspension (1000 mmol/g total titrable acids, pH 2.5) until pH 7 was reached. The resulting suspensions were then freeze-dried. Briefly, 200 mg of the dried product was added to 20 mL of solvent. The suspensions were sonicated with an energy input of 2000 J, except for cyclohexane for which 5000 J of sonication energy was applied. The suspension was then diluted 20 times in the appropriate solvent for a final concentration of 0.05 w/v. % for proper measurement of the particle size. The size of the particles in the resulting suspensions was measured by DLS and is reported in table 5.

TABLE 5

Redispersed particle size of TEMPO-oxidized CNC/Polyalkylether amine dried product.

| Solvent | Polyalkylether amine content Wt. % | Z-average (±5 nm) | Quality of dispersion |
| --- | --- | --- | --- |
| Chloroform (M-2070) | 68 | 92 ± 2 | Excellent |
| Toluene (M-2070) | 68 | 140 ± 14 | Excellent |
| Cyclohexane (M-2005) | 69 | 267 ± 2 | Fair |

Example 5) Type 2 CNC: Freeze-Dried CelluForce Sulfuric Acid Extracted CNC: Enhancement of Redispersibility in Aqueous Media The addition of polyetheramines also helps the dispersion of dried cellulose nanocrystals in aqueous systems as well. It is typically the objective that the dried nanoparticles retain the original suspension properties (such as particle size) of the never-dried material after redispersion in the suspending media. Table 3 reports the redispersed particle size in pure water of commercial CNCs as well as the modified polyetheramine/sulfuric acid extracted CNC adducts. Briefly, 200 mg of dried material was added to 20 mL of deionized water. The suspensions were vortexed for 1 minute each and left to stand for about 30 minutes. The suspensions were then diluted 20 times for final concentrations of 0.05 w/v. %. The before and after drying measurements of particle size by DLS experiments is summarized in Table 3.

In all cases, the samples containing polyetheramines had smaller redispersed particle size than the sodium hydroxide neutralized sulfuric acid extracted CNC (Na—CNC) obtained from CelluForce. For comparison, a polyethylene glycol of similar molecular weight was added to a neutral sulfuric acid extracted suspension prior to freeze-drying in order to assess the redispersibility of such samples. While there is a slight reduction in the redispersed particle size, it is not as significant as when a polyalkylether amine is used. This is likely due to different modes of interaction between the polymer and the CNC surface, since ionic bonding is impossible with PEG. As a result, non-amine terminated polyalkylethers do not show the same capabilities when incorporated in dried forms of CNCs.

TABLE 6

Redispersed particle size of freeze-dried neutralized (with corresponding polyetheramine) CelluForce sulfuric acid extracted CNC/Jeffamine ™ before and after drying.

| Additive | Particle size before drying (nm) | Redispersed particle size (±5 nm) | Quality of dispersion |
| --- | --- | --- | --- |
| None (Na-CNC) | 90 | 135 | Excellent |
| PEG2050 + Na-CNC | 90 | 123 | Excellent |
| M-2005 | 87 | 105 | Excellent |
| M-2070 | 91 | 89 | Excellent |

Moreover, direct redispersion of the dried material in high ionic strength media such as brines or salt water is possible. While the particle size in such suspensions is high because of some agglomeration, stable suspensions for over 24 hours are achieved.

Example 6) Type 1 CNC: Freeze-Dried Desulfated-CNC: Dispersion in Aqueous Media

Polyether modification of very low surface charge desulfated CNCs (60 mmol/kg of titrable acid content) also improves its redispersion from the dried state back into water. Desulfated CNCs were produced using an adapted method from the literature (L. Lewis, et al. Biomacromolecules, vol. 17, pp. 2747-2754, 2016). Briefly, HCl was added to a 2 wt. % CelluForce sulfuric acid extracted CNC suspension until pH 2.3 was reached. The suspension was then heated under hydrothermal conditions at 150° C. for 30 minutes in a closed stainless steel vessel submerged in triethylene glycol. The titrable acid content was analyzed by conductometric titration of the purified material. After treatment, the suspension was dialyzed using 12-14 kDa molecular weight cutoff cellophane membranes followed by treatment with an acidic ion exchange resin. Typically, CNC suspensions at these low charge levels are unstable and tend to agglomerate which makes them difficult to redisperse when neutralized using sodium hydroxide or even tetralkylammonium hydroxide such as tetrabutylammonium hydroxide (TBAOH). The use of a polyetheramine makes even very low charged CNC particles redispersible from the dried state without the use of sonication. The samples were prepared by neutralizing the suspension using the appropriate base (NaOH, TBAOH or M-2070) until pH 7. The suspensions were then freeze-dried for redispersion assessment.

For the dispersion test, 200 mg of freeze-dried material was added to 20 mL of deionized water. The suspensions were vortexed for 1 minute each and mixed with a T25 Ultra Turrax™ high shear mixer (IKA) for 5 minutes. The suspensions were then diluted 20 times for final concentrations of 0.05 w/v. %. The before and after drying measurements of particle size by DLS experiments is summarized in table 4. Only the desulfated CNC bearing the M-2070 polyetheramine on its surface could be redispersed with a satisfactory particle size.

TABLE 7

Redispersed particle size of modified desulfated CNCs with different methods.

| Surface composition | Particle size before drying (nm) | Redispersed particle size (nm) | Quality of dispersion |
| --- | --- | --- | --- |
| Desulfated acidic CNC | 193 | >1000 | Poor |
| Na | 191 | >1000 | Poor |
| TBA | 180 | >1000 | Poor |
| M-2070 | 190 | 254 ± 2 | Excellent |

Example 7) Type 5 CNC: Freeze-Dried TEMPO-Oxidized CNC: Tunability of Dispersion Properties Through Surface Charge Density and Polymer Chain Length or Composition The combination of a high surface charge CNC particle with a shorter polyetheramine chain leads to different dispersion properties than the combination of low charge CNC particle with a longer polymer chain. The particle size of redispersed TEMPO-oxidized CNC/Jeffamine M-1000 dried material in ethanol, acetone and ethylene glycol is shown in table 8. The samples show a smaller redispersed particle size in ethanol which indicates better redispersion (112 vs. 175 nm). The sample shows similar particle size in ethylene glycol and could not form stable dispersions in acetone, unlike the previous samples in examples 1, 2 and 3.

TABLE 8

Redispersed particle size of TEMPO-oxidized CNC/Jeffamine M-1000 polyetheramine dried product.

| Solvent | Polymer mass ratio Wt. % | Z-average (±5 nm) | Quality of dispersion |
| --- | --- | --- | --- |
| Ethanol | 32 | 112 ± 6 | Excellent |
| Acetone | 32 | >1000 | Poor |
| Ethylene glycol | 32 | 98 ± 2 | Excellent |

Example 8) Type 2 and 3 CNCs: Freeze-Dried Sulfuric Acid Extracted CNCs: Dispersion in Non-Polar Solvents (Chloroform, Toluene and Cyclohexane)

In this example, a commercial polyetheramine from Huntsman (Jeffamine™ M-3085, m.w. 3000 g/mol) was dissolved into 200 g of a 2 wt. % sulfuric acid extracted acidic CNC suspension (pH 2.3-3.0, 240 mmol/kg of titrable acids for CelluForce CNCs or 340 mmol/kg for USFPL CNCs) until pH 7 was reached. The resulting neutral suspension was then freeze-dried. For redispersion, 200 mg of dried material was placed in 20 mL of solvent (1 w/v % final solids concentration). The suspensions were sonicated using an 8 mm probe sonicator (Cole-Parmer, USA) with an energy input of 2000 J at maximum amplitude. The suspension was then diluted 20 times in the appropriate solvent for a final concentration of 0.05 w/v. % for proper measurement of particle size. The particle sizes are reported in table 9. We find the combination of CelluForce sulfuric acid extracted CNCs with Jeffamine M-3085 to be redispersible in non-polar solvents such as chloroform and toluene. USFPL sulfuric acid extracted CNCs were redispersible in chloroform. The samples were not redispersible in cyclohexane.

TABLE 9

Redispersed particle size of sulfuric acid extracted CNC/M-3085 polyetheramine dried product.

| Source | Solvent | Polymer mass ratio Wt. % | Z-average (nm) | Quality of dispersion |
|---|---|---|---|---|
| CelluForce | Chloroform | 44 | 162 ± 5 | Excellent |
| | Toluene | 44 | 581 ± 30 | Fair |
| | Cyclohexane | 44 | >1000 | Poor |
| USFPL | Chloroform | 49 | 188 ± 9 | Excellent |
| | Toluene | 49 | >1000 | Poor |
| | Cyclohexane | 49 | >1000 | Poor |

Example 9) Type 2 CNC: Freeze-Dried Sulfuric Acid Extracted CNCs: Dispersion in Polar Non-Protic Solvents (Methyl Ethyl Ketone ($\varepsilon$=18.5) and Ethyl Acetate ($\varepsilon$=6))

In this example, a commercial polyetheramine from Huntsman (Jeffamine™ M-3085, m.w. 3000 g/mol) was dissolved into 200 g of a 2 wt. % sulfuric acid extracted acidic CNC suspension (pH 2.3-3.0, 240 mmol/kg of titrable acids) until pH 7 was reached. The resulting neutral suspension was then freeze-dried. For redispersion, 200 mg of dried material was placed in 20 mL of solvent (1 wt. % final solids concentration). The suspensions were sonicated using an 8 mm probe sonicator (Cole-Parmer, USA) with an energy input of 2000 J at maximum amplitude. The suspension was then diluted 20 times in the appropriate solvent for a final concentration of 0.05 w/v. % for proper measurement of particle size. The particle sizes are reported in table 10. The product is redispersible in methyl ethyl ketone as well as ethyl acetate.

TABLE 10

Redispersed particle size of a CelluForce sulfuric acid extracted CNC/M-3085 polyetheramine dried product.

| Solvent | Polymer mass ratio Wt. % | Z-average (nm) | Quality of dispersion |
|---|---|---|---|
| Methyl ethyl ketone | 44 | 391 ± 9 | Fair |
| Ethyl acetate | 44 | 390 ± 5 | Fair |

Example 10) Type 2 CNC: CelluForce Freeze-Dried Sulfuric Acid Extracted CNCs Adducts with Hydrophobic Jeffamine XTJ-436)

In this example, hydrophobic Jeffamine XTJ-436, m.w. 1000 g/mol is used to neutralize 200 g of a 2 wt. % CelluForce sulfuric acid extracted acidic CNC suspension (pH 2.3-3.0, 240 mmol/kg of titrable acids) until pH 7 was reach. Since this particular Jeffamine has low water solubility, the suspension was homogenized using an IKA® ULTRA-TURRAX T-25 disperser at 22 k RPM to ensure proper distribution of the Jeffamine in the suspension. The resulting suspension was then freeze-dried. For redispersion, 200 mg of dried material was placed in 20 mL of solvent (1 wt. % final solids concentration). The suspensions were sonicated using an 8 mm probe sonicator (Cole-Parmer, USA) with an energy input of 2000 J at maximum amplitude. The suspension was then diluted 20 times in the appropriate solvent for a final concentration of 0.05 w/v % for proper measurement of particle size. The particle sizes are reported in table 11. We find the dried product to be redispersible in ethanol.

TABLE 11

Freeze-dried sulfuric acid extracted CNC adducts with hydrophobic Jeffamine XTJ-436)

| Solvent | Polymer mass ratio Wt. % | Z-average (nm) | Quality of dispersion |
|---|---|---|---|
| Ethanol | 39 | 204 | Fair |
| Acetone | 39 | >1000 | Poor |
| Ethylene glycol | 39 | >1000 | Poor |
| Toluene) | 39 | >1000 | Poor |

Example 11) Type 2 CNC: Freeze-Dried Sulfuric Acid Extracted CNC: Dispersion in Polar Solvents (Water, Ethanol, Acetone and Ethylene Glycol)

A commercial polyetheramine from Huntsman (Jeffamine™ M-1000, m.w. 2000 g/mol) was dissolved into 200 g of a 2 wt. % sulfuric acid extracted acidic CNC suspension (pH 2.3-3.0, 240 mmol/kg of titrable acids for CelluForce CNCs or 340 mmol/kg for USFPL CNCs) until pH 7 was reached. The suspension was then freeze-dried and the solid product was redispersed using 200 mg of dried material in 20 mL of solvent (1 w/v % final solids concentration). The suspensions were sonicated using an 8 mm probe sonicator (Cole-Parmer, USA) with an energy input of 2000 J at maximum amplitude. The suspension was then diluted 20 times in the appropriate solvent for a final concentration of 0.05 w/v. % for proper measurement of particle size. Sonication is not necessary to achieve nanometric dispersions but will reduce the particle size. The particle size of the CNCs in the resulting suspensions was measured by dynamic light scattering (DLS) and is reported in table 12. For both samples of sulfuric acid extracted CNCs, we find that Jeffamine M-1000 adducts have a narrower range of solvents with good redispersibility. We find excellent redispersion qualities in water as well as ethylene glycol while samples in ethanol have larger particle size, indicating more difficulty to redisperse. The products could not be redispersed in acetone.

TABLE 12

Freeze-dried sulfuric acid extracted CNC adducts with Jeffamine M-1000

| Source | Solvent | M-1000 content Wt. % | Z-average (nm) | Quality of dispersion |
|---|---|---|---|---|
| CelluForce | Water | 20 | 85 ± 2 | Excellent |
| | Ethanol | 20 | 431 ± 12 | Fair |
| | Acetone | 20 | >1000 | Poor |
| | Ethylene glycol | 20 | 76 ± 2 | Excellent |
| USFPL | Water | 29 | 79 ± 2 | Excellent |
| | Ethanol | 29 | 442 ± 18 | Fair |
| | Acetone | 29 | >1000 | Poor |
| | Ethylene glycol | 29 | 75 ± 2 | Excellent |

Example 12) Type 2 CNC: Freeze-Dried Sulfuric Acid Extracted CNC: Formation of Transparent Films from the Dried Product Dried products produced from the method described in this patent may be pelletized or molded into transparent forms including films by compression. In a standard procedure, 100 mg of dried CelluForce CNC/M-2070 polyetheramine adduct from example 1 was put in a CrushIR digital hydraulic press (PIKE). Three different samples were generated by applying 2.5, 5 or 10 tons of force and holding it for 20 seconds. The samples were collected and the transparency could be qualitatively assessed by visual inspection. Both freeze-dried and spray-dried forms from examples 1 and 2 have this behavior.

Figure 2:
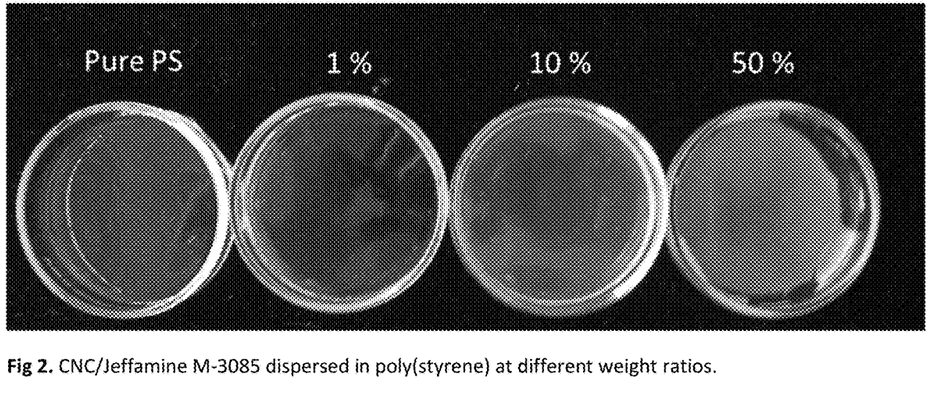
FIG. 2. is a picture of a composite prepared from CNC and Jeffamine M-3085 dispersed in poly(styrene) at different weight ratios.

Example 13) Type 2 CNC: Incorporation of CelluForce Sulfuric Acid Extracted CNC/Jeffamine M-3085 Adduct in Poly(Styrene) Using Solution Casting from Chloroform A dried adduct of CelluForce sulfuric acid extracted CNCs neutralized with Jeffamine M-3085 is redispersed in chloroform at a concentration of 3 w/v % assisted by ultra-sonication treatment. A solution of 3 w/v % of poly (styrene) (m.w. 192 000 g/mol from Sigma-Aldrich) is prepared by magnetic stirring until full dissolution of the pellets is achieved. To prepare the polymer/CNC composites, the CNC suspension is added to the polymer solution in different amounts to reach final mass ratios of 1, 10 and 50 wt. % of CNC adduct/polymer. Solid films are obtained by drying of the chloroform in a fume hood. The composites (FIG. 2) are transparent even for large CNC content, which is indicative of low particle size. There is also an increased blue hue to the samples, which is caused by the scattering of light by the CNCs.

Figure 3:
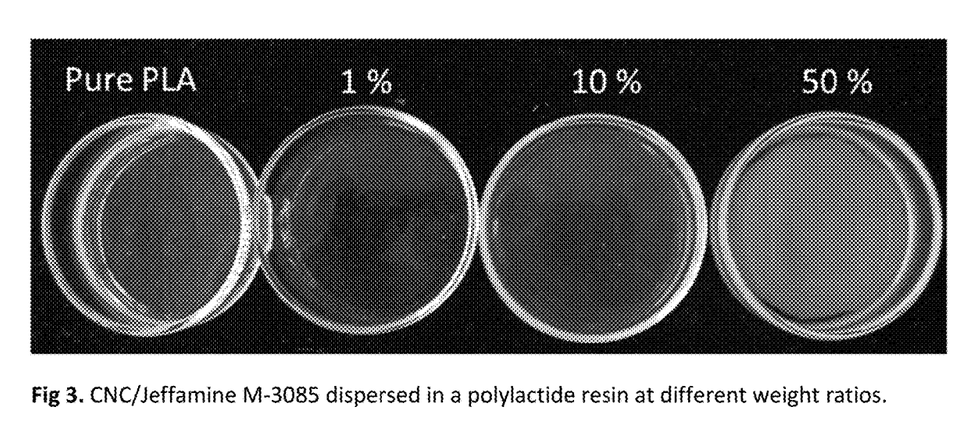
FIG. 3. is a picture of a composite prepared from CNC and Jeffamine M-3085 dispersed in polylactide at different weight ratios.

Example 14) Type 2 CNC: Incorporation of CelluForce Sulfuric Acid Extracted CNC/Jeffamine M-3085 Adduct in a Commercial Polylactide Resin Using Solution Casting from Chloroform A dried adduct of CelluForce sulfuric acid extracted CNCs neutralized with Jeffamine M-3085 is redispersed in chloroform at a concentration of 3 w/v % assisted by ultra-sonication treatment. A solution of 3 w/v % of a polylactide resin (Ingeo™ Biopolymer 2003D from NatureWorks) is prepared by magnetic stirring until full dissolution of the pellets is achieved. To prepare the polymer/CNC composites, the CNC suspension is added to the polymer solution in different amounts to reach final mass ratios of 1, 10 and 50 wt. % of CNC adduct/polymer. Solid films are obtained by drying of the chloroform in a fume hood. The composites (FIG. 3) are transparent, which is indicative of low particle size. There is also an increased blue hue to the samples, which is caused by the scattering of light by the CNCs.

Figure 4:
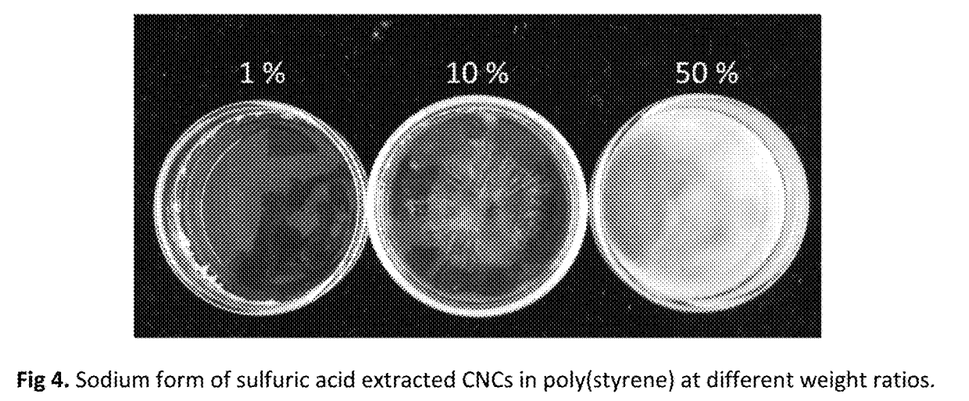
FIG. 4. is a picture of a composite prepared from a sodium form of sulfuric acid extracted CNC in poly(styrene) at different weight ratios.

Example 15) Type 2 CNC: Incorporation of Sodium Form CelluForce Sulfuric Acid Extracted CNC in Poly(Styrene) Using Solution Casting from Chloroform Dried sodium form CelluForce sulfuric acid extracted CNCs are redispersed in chloroform at a concentration of 3 w/v % assisted by ultra-sonication treatment. A solution of 3 w/v % of poly(styrene) (m.w. 192 000 g/mol from Sigma-Aldrich) is prepared by magnetic stirring until full dissolution of the pellets is achieved. To prepare the polymer/CNC composites, the CNC suspension is added to the polymer solution in different amounts to reach final mass ratios of 1, 10 and 50 wt. % of CNC adduct/polymer. Solid films are obtained by drying of the chloroform in a fume hood. The composites (FIG. 4) show visible aggregates of dried CNCs, which indicates nanometric dispersions of the particles is not achieved.

All cited references are hereby incorporated by reference in full.

The invention claimed is:

1. A redispersible cellulose nanocrystal (CNC) wherein said redispersible CNC is comprising non-covalent ionic adduct of a cationic groups formed from a protonated amine compound and anionic groups formed from titrable acidic groups, wherein said titrable acidic groups are located at the surface of said redispersible CNC, wherein said titrable acidic group is comprising sulfate half-esters, and wherein said redispersible CNC is in an isolated dried form, wherein said amine compound is a monoamine-terminated polyalkane, a monoamine-terminated polyalkylether or a monoamine-terminated polyalkylene imine.

2. The redispersible CNC as defined in claim 1, wherein the sulfate half-esters are unmodified or desulfated.

3. The redispersible CNC as defined in claim 1, wherein said amine compound is an amine-terminated polyalkane, an amine-terminated polyalkylether or an amine-terminated polyalkylene imine.

4. The redispersible CNC as defined in claim 1, wherein said amine compound is monoamine-terminated polyalkylether having the formula:

wherein said polyalkylether may be a homopolymer, an AB or ABA block copolymer, or an alternating copolymer;

$R_1$ is H, or selected from an optionally substituted, linear or branched alkyl of 1 to 14 carbon atoms; or $R_1$ is an optionally substituted aryl of 6 to 10 carbon atoms; or $R_1$ is an alkyl-arylene- group wherein each of said alkyl and arylene residues are independently optionally substituted and further said alkyl residue is linear or branched alkyl of 1 to 14 carbon atoms and said arylene residue is comprising 6 to 10 carbon atoms;

a or b are each independently an integer from 1 to 60, wherein optionally one of said a or b may be zero (0) in the case of an homopolymer;

x is an integer from 1 to 4.

5. The redispersible CNC as defined in claim 1, wherein said amine compound is an amine-terminated polyalkylether having the formula:

wherein a and b a or b are each independently an integer from 1 to 60, wherein optionally one of said a or b may be zero (0) in the case of an homopolymer, R2 at each occurrence of monomer b can be R2=H for ethylene oxide (EO) or R2=$CH_3$ for propylene oxide (PO).

6. The redispersible CNC as defined in claim 5, wherein the polyethylene/polypropylene oxide (PO/EO) ratio is from 1/10 to 10/1.

7. The redispersible CNC as defined in claim 1, wherein said amine compound has a molecular weight from 300 and 5000 g/mol.

8. The redispersible CNC as defined in claim 1, which is in a pelletized or molded form.

9. A method for producing an isolated dried redispersible cellulose nanocrystal (CNC) comprising
  i) providing an aqueous suspension of an acidic CNC comprising sulfuric acid;
  ii) mixing an amount of an amine compound with said suspension of an acidic CNC, wherein said amount is sufficient to cause the pH of said suspension to increase to about below the pKa of the protonated amine compound; and
  iii) drying the suspension resulting from step ii to produce said redispersible CNC having a titrable acidic group comprising sulfate half-esters.

10. The method of claim 9, wherein the molar ratio of said amine compound to titrable acidic groups in the acidic CNC is about 1:1.

11. The method of claim 9, wherein the molar ratio of said amine compound to titrable acidic groups in the acidic CNC is such that said pH of the suspension is between about 3 and 10, the final pH of the suspension is about neutral.

12. The method of claim 11, wherein said pH of the suspension is about 7.

13. The method of claim 9, wherein said amine compound is monoamine-terminated polyalkylether having the formula:

wherein said polyalkylether may be a homopolymer, an AB or ABA block copolymer, or an alternating copolymer;

$R_1$ is H, or selected from an optionally substituted, linear or branched alkyl of 1 to 14 carbon atoms; or $R_1$ is an optionally substituted aryl of 6 to 10 carbon atoms; or $R_1$ is an alkyl-arylene- group wherein each of said alkyl and arylene residues are independently optionally substituted and further said alkyl residue is linear or branched alkyl of 1 to 14 carbon atoms and said arylene residue is comprising 6 to 10 carbon atoms;

a or b are each independently an integer from 1 to 60, wherein optionally one of said a or b may be zero (0) in the case of an homopolymer;

x is an integer from 1 to 4.

14. The method of claim 9, wherein said amine compound is an amine-terminated polyalkylether having the formula:

wherein a and b a or b are each independently an integer from 1 to 60, wherein optionally one of said a or b may be zero (0) in the case of an homopolymer, R2 at each occurrence of monomer b is independently R2=H for ethylene oxide (EO) or R2=CH$_3$ for propylene oxide (PO).

15. A polymer composite comprising a redispersible CNC as defined in claim 1.

* * * * *